(12) United States Patent
Matamis et al.

(10) Patent No.: US 8,143,156 B2
(45) Date of Patent: Mar. 27, 2012

(54) METHODS OF FORMING HIGH DENSITY SEMICONDUCTOR DEVICES USING RECURSIVE SPACER TECHNIQUE

(75) Inventors: George Matamis, San Jose, CA (US); James Kai, Santa Clara, CA (US); Takashi Orimoto, Sunnyvale, CA (US); Nima Mokhlesi, Los Gatos, CA (US)

(73) Assignee: SanDisk Technologies Inc., Plano, TX (US)

( * ) Notice: Subject to any disclaimer, the term of this patent is extended or adjusted under 35 U.S.C. 154(b) by 1066 days.

(21) Appl. No.: 11/765,866

(22) Filed: Jun. 20, 2007

(65) Prior Publication Data

US 2008/0318381 A1    Dec. 25, 2008

(51) Int. Cl.
*H01L 21/4763* (2006.01)

(52) U.S. Cl. ........ 438/622; 438/623; 438/624; 438/625; 438/626

(58) Field of Classification Search ............ 438/622–626
See application file for complete search history.

(56) References Cited

U.S. PATENT DOCUMENTS

| 6,888,755 | B2 | 5/2005 | Harari et al. | |
|---|---|---|---|---|
| 7,951,669 | B2 | 5/2011 | Harari et al. | |
| 2005/0215040 | A1* | 9/2005 | Doyle | 438/585 |
| 2006/0046407 | A1* | 3/2006 | Juengling | 438/301 |
| 2006/0240361 | A1* | 10/2006 | Lee et al. | 430/313 |
| 2007/0026684 | A1* | 2/2007 | Parascandola et al. | 438/733 |
| 2008/0008969 | A1* | 1/2008 | Zhou et al. | 430/313 |
| 2008/0122125 | A1* | 5/2008 | Zhou | 257/797 |
| 2008/0299774 | A1* | 12/2008 | Sandhu | 438/696 |

OTHER PUBLICATIONS

Jeffrey Bokor, U.C. Berkeley Nanoelectronics and Nanostructures Group—Research Projects, University of California, Berkeley, EECS, "Electronic Devices, Carbon Nanotube Electronics, Integration of Carbon Nanotube Devices with Silicon Technology," Retrieved from the Internet Jun. 19, 2006.

Yang-Kyu Choi et al., "Sublithographic nanofabrication technology for nanocatalysts and DNA chips," J. Vac. Sci. Technol. B, vol. 21, No. 6, Nov/Dec 2003 (American Vacuum Society), pp. 2951-2955.

\* cited by examiner

*Primary Examiner* — James Mitchell

(74) *Attorney, Agent, or Firm* — Vierra Magen Marcus & DeNiro LLP

(57) ABSTRACT

High density semiconductor devices and methods of fabricating the same are disclosed. Spacer fabrication techniques are utilized to form circuit elements having reduced feature sizes, which may be smaller than the smallest lithographically resolvable element size of the process being used. A first set of spacers may be processed to provide planar and parallel sidewalls. A second set of spacers may be formed on planar and parallel sidewalls of the first set of spacers. The second set of spacers serve as a mask to form one or more circuit elements in a layer beneath the second set of spacers. The steps according to embodiments of the invention allow a recursive spacer technique to be used which results in robust, evenly spaced, spacers to be formed and used as masks for the circuit elements.

10 Claims, 19 Drawing Sheets

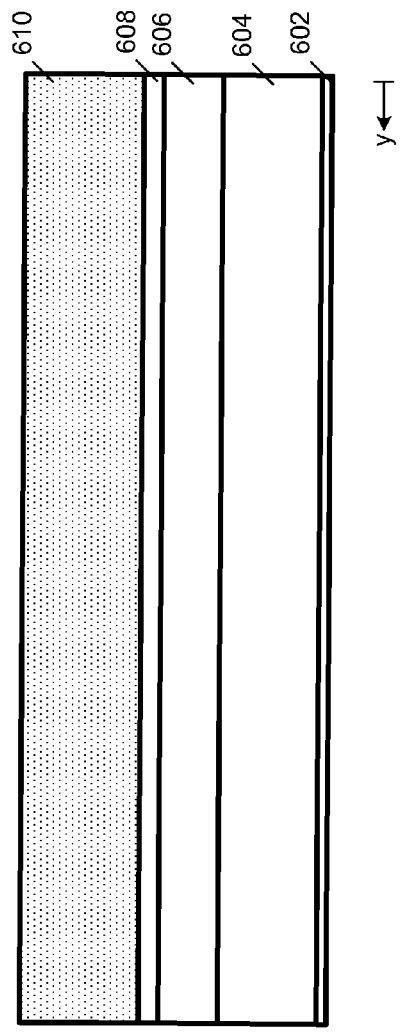
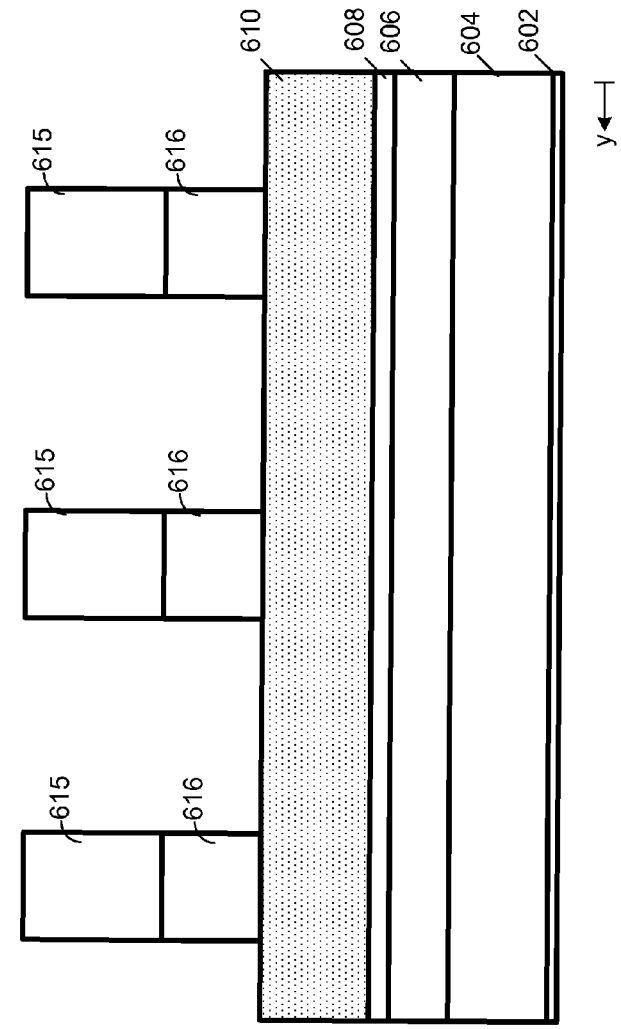
FIG. 6A
FIG. 6B

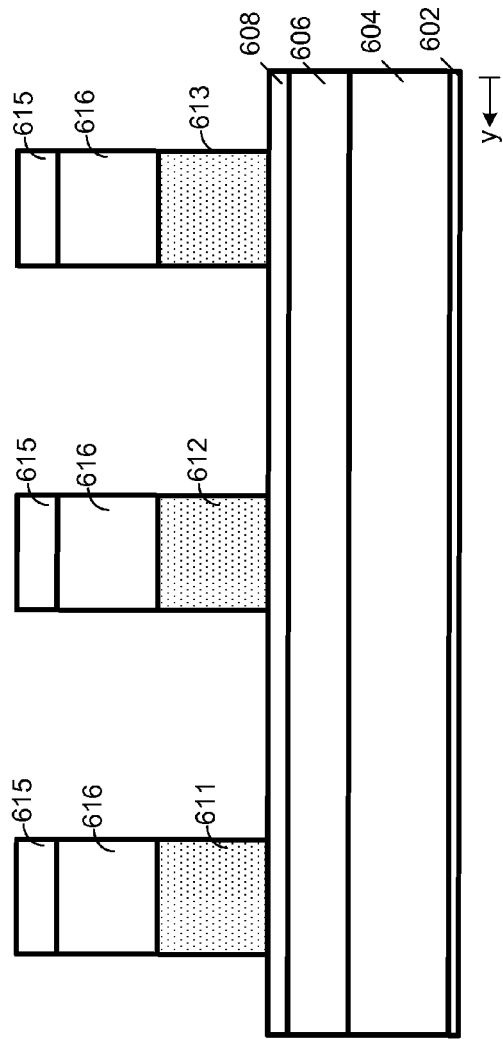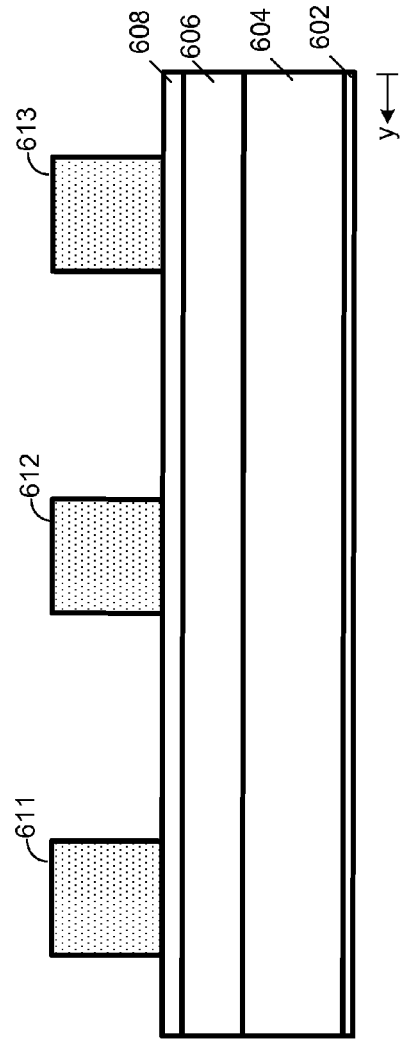

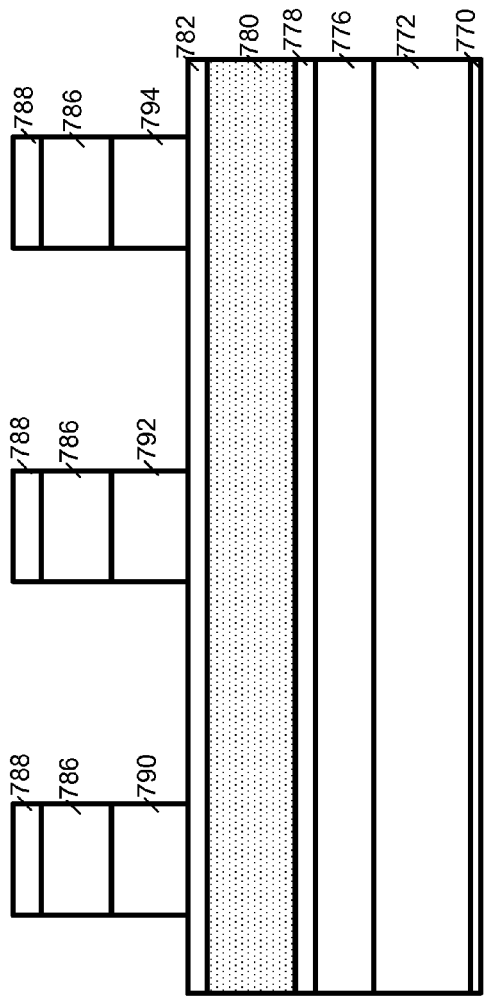
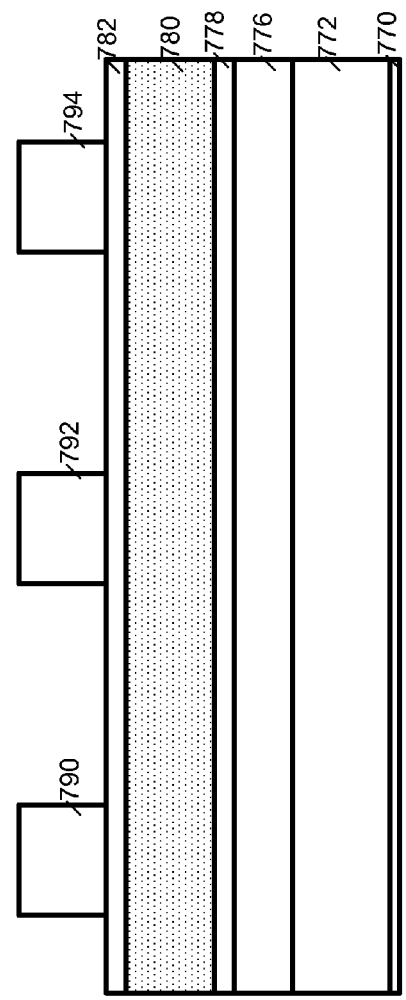
FIG. 7C
FIG. 7D

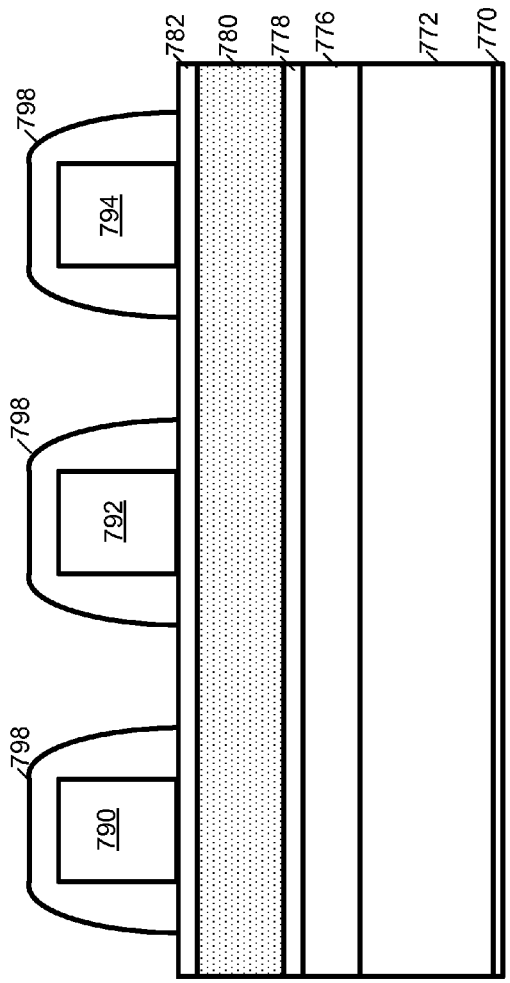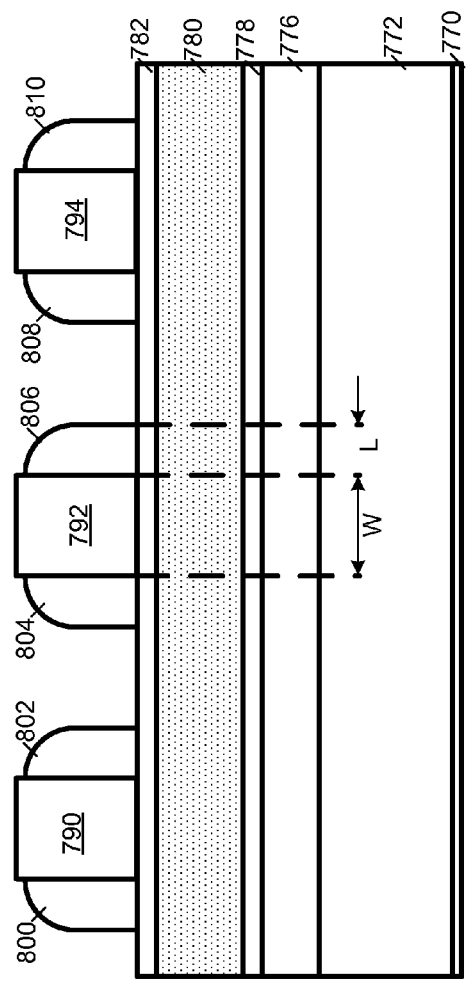
FIG. 7E
FIG. 7F

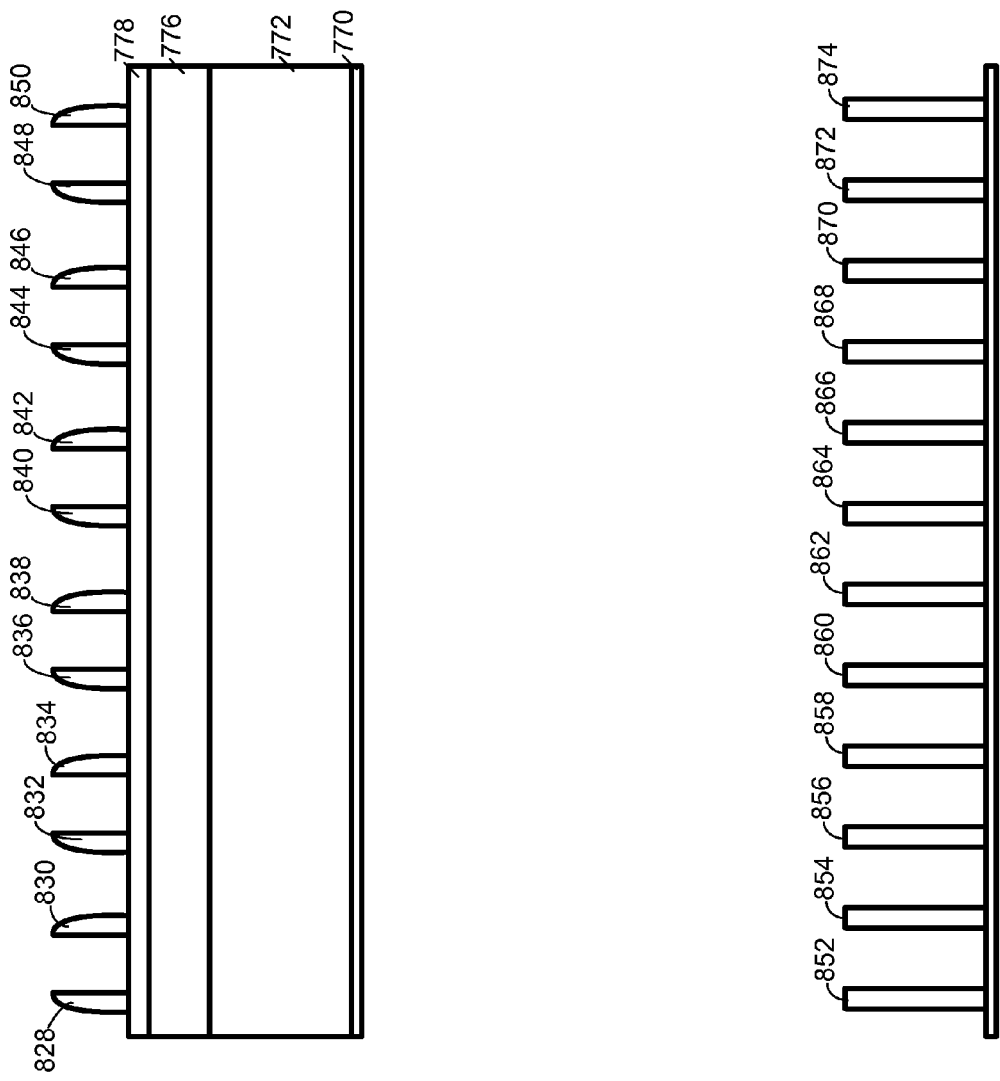

METHODS OF FORMING HIGH DENSITY SEMICONDUCTOR DEVICES USING RECURSIVE SPACER TECHNIQUE

BACKGROUND OF THE INVENTION

1. Field of the Invention

Embodiments of the present disclosure are directed to high density semiconductor devices, such as non-volatile memory, and methods of forming the same.

2. Description of the Related Art

As the size of electronic devices continue to decrease, there is continual pressure to shrink the substrate area required to implement the various integrated circuit functions. Semiconductor memory devices, for example, and the fabrication processes therefor are continuously evolving to meet demands for increases in the amount of digital data that can be stored in a given area of a silicon substrate. Such demands stem from a desire to increase the storage capacity within a memory card while maintaining or even decreasing the card form factor.

Electrical Erasable Programmable Read Only Memory (EEPROM), including flash EEPROM, and Electronically Programmable Read Only Memory (EPROM) are among the most popular non-volatile semiconductor memories. One popular flash EEPROM architecture utilizes a NAND array having a large number of strings of memory cells connected through one or more select transistors between individual bit lines and common source lines. FIG. 1 is a top view showing a single NAND string and FIG. 2 is an equivalent circuit thereof. The NAND string depicted in FIGS. 1 and 2 includes four transistors 100, 102, 104 and 106 in series and sandwiched between a first select gate 120 and a second select gate 122. Select gate 120 connects the NAND string to a bit line via bit line contact 126. Select gate 122 connects the NAND string to a common source line via source line contact 128. Each of the transistors 100, 102, 104 and 106 includes a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, or more.

The charge storage elements of current flash EEPROM arrays are most commonly electrically conductive floating gates, typically formed from doped polysilicon material. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," EEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Memory cells of a typical non-volatile flash array are divided into discrete blocks of cells that are erased together. That is, the block contains the minimum number of cells that are separately erasable together as an erase unit, although more than one block may be erased in a single erasing operation. Each block typically stores one or more pages of data, where a page includes the minimum number of cells that are simultaneously subjected to a data programming and read operation as the basic unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in which it is stored.

As demands for higher densities in integrated circuit applications have increased, fabrication processes have evolved to reduce the minimum feature sizes of circuit elements such as the gate and channel regions of transistors. For example, Choi et al., "Sublithographic Nanofabrication Technology for Nanocatalysts and DNA Chips," J. Vac. Sci. Technol. B 21(6), November/December 2003, pp. 2951-2955, describes an iterative spacer lithography technique which multiplies the pattern density in an integrated circuit to achieve an element length and a corresponding space therebetween that is smaller than a minimum definable lithographic feature size. Such decreases in the sizes of circuit elements, as well as other considerations, increase the need for precision in fabrication processes and integrity in resulting materials.

Known iterative spacer lithography techniques do not address the issue of how to obtain specific desired relative sizes of element length and corresponding spaces between elements in a finished integrated circuit. For example, known iterative spacer technology does not disclose the starting points and steps required to obtain a finished integrated circuit where the element length is equal to the length of the space between elements (or some other desired endpoint length and spacing).

Moreover, known iterative spacer lithography techniques disclose deposition of layers on rounded surfaces formed during the iterative spacer lithography steps. In particular, when the first set of spacers are formed, these spacers have a non-uniform profile; namely, a straight edge formed against the structure on which they are deposited, and a curved edge defined by the etching step by which the spacers are defined. Conventionally, a second spacer layer is formed on the first spacer layer. However, because the first spacer layer has a non-uniform profile (one rounded edge and one straight edge), forming the subsequent spacer layer on the conventional first spacer layer will result in an unpredictable and less robust profile of the second spacer layer. As the second spacer layer forms the mask for the resulting conductive gate regions, it is imperative that the profile of the second spacer layer be highly predictable, controllable and robust.

SUMMARY OF THE INVENTION

High density semiconductor devices and methods of fabricating the same are provided in accordance with one or more embodiments. Spacer fabrication techniques are utilized to form circuit elements having reduced feature sizes, which may be smaller than the smallest lithographically resolvable element size of the process being used. In embodiments, a first set of spacers are formed on lithographically defined strips. These spacers have a straight edge and a rounded edge. Accordingly, prior to deposition of the second set of spacers, the first set of spacers are processed to form structures having parallel and planar side walls.

In one embodiment, the processing of the first spacer layer involves an additional conformal deposition step and a chemical-mechanical polishing step which removes non-uniform rounded edges from the first set of spacers, and results in planar and parallel sidewalls upon which a subsequent set of spacers may be evenly and robustly formed. In an alternative embodiment, an additional sacrificial layer is provided so that the non-uniform spacers in a first sacrificial layer may be used as a mask for forming strips having uniform parallel and planar sidewalls in the second sacrificial layer. A second set of spacers may then be formed on the uniform sidewalls of the second sacrificial layer.

It is another feature of the present invention that, through the iterative spacer technique, the length and spacing of the conductive gate regions may be even with each other (or formed to some other desired end point length and spacing) using easily obtainable initial lithography dimensions. While such geometries are not obtainable via only standard lithography, the iterative spacer technique according to the present invention makes it possible. Prior art spacer techniques do not contemplate controlling the geometry (length and spacing) of the start point and successive spacer layers to obtain a desired endpoint length and spacing.

Other features, aspects, and objects of the disclosed technology can be obtained from a review of the specification, the figures, and the claims.

BRIEF DESCRIPTION OF THE DRAWINGS

FIGS. 7A-7L depict a portion of the memory array of FIG. 4 at various steps during a fabrication process in accordance with an alternative embodiment of the present invention.

DETAILED DESCRIPTION

Embodiments in accordance with the present disclosure can be used in the formation of numerous types of high density semiconductor devices. A spacer and corresponding formation technique provided robust, evenly spaced fabricated elements. While not so limited, the described techniques can achieve feature sizes that are smaller than the smallest lithographically resolvable element size of the process being used. This can facilitate the high density formation of numerous types of elements in integrated semiconductor device fabrication. Various features and techniques are presented with respect to the NAND flash memory architecture. It will be appreciated from the provided disclosure that implementations of the disclosed technology are not so limited. By way of non-limiting example, embodiments in accordance with the present disclosure can provide and be used in the fabrication of a wide range of semiconductor devices, including but not limited to logic arrays, volatile memory arrays including SRAM and DRAM, and non-volatile memory arrays including both the NOR and NAND architecture.

Figure 1:
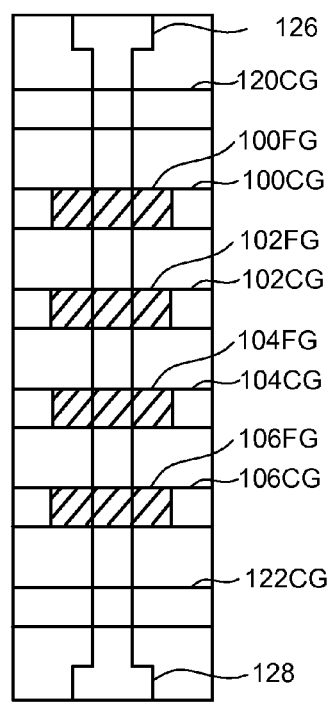
FIG. 1 is a top view of a NAND string.
Figure 2:
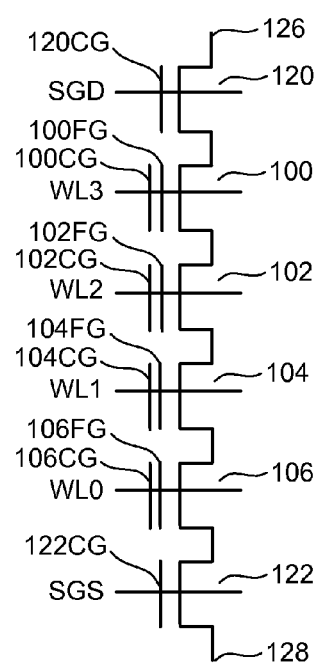
FIG. 2 is an equivalent circuit diagram of the NAND string depicted in FIG. 1.
Figure 3:
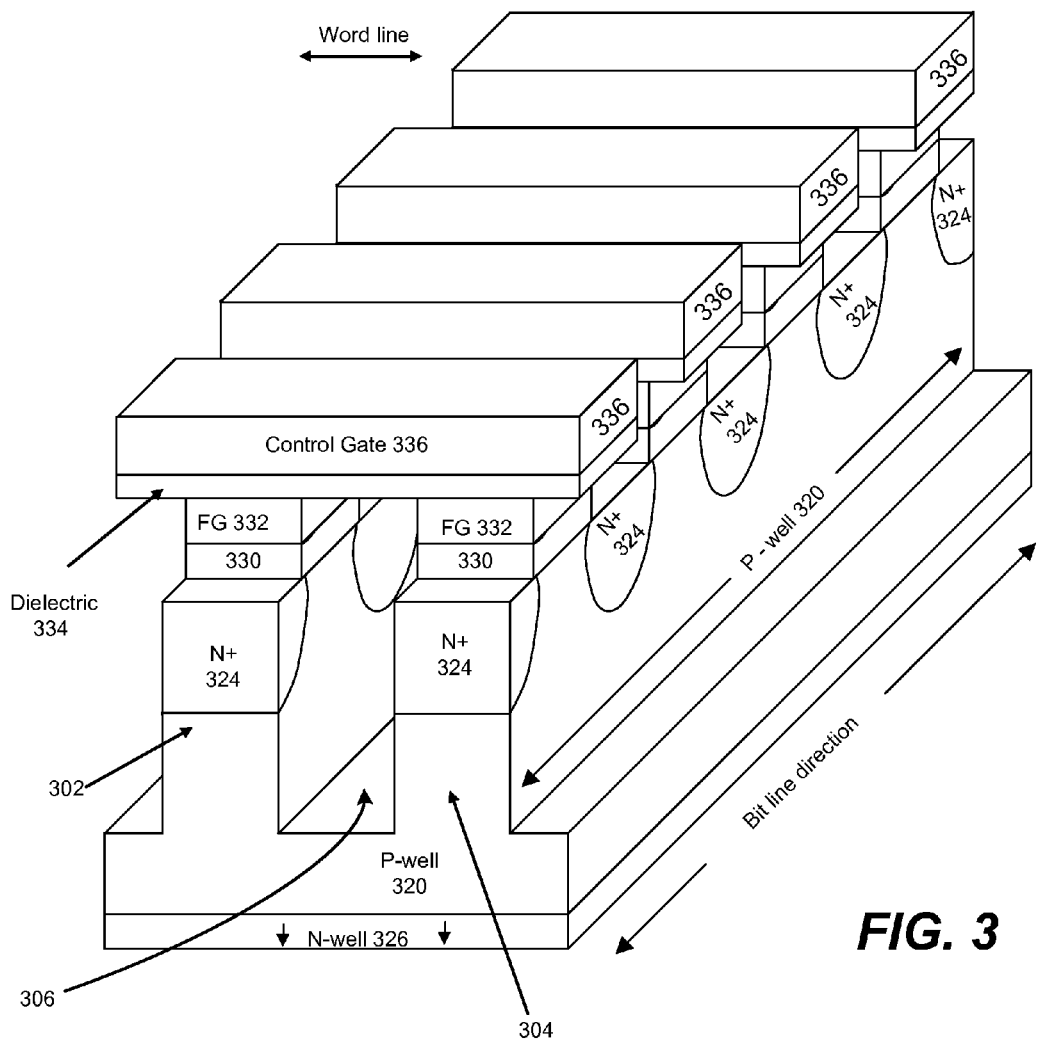
FIG. 3 is a three-dimensional drawing of a pair of four word line long portions of two NAND strings that can be fabricated in accordance with one embodiment.

FIG. 3 is a three-dimensional block diagram of two typical NAND strings 302 and 304 that may be fabricated as part of a larger flash memory array. While FIG. 3 depicts four memory cells on strings 302 and 304, more or less than four memory cells can be used. FIG. 3 further depicts N-well 326 below P-well 320, the bit line direction along the NAND string, and the word line direction perpendicular to the NAND string or bit line direction. The P-type substrate below N-well 326 is not shown in FIG. 3. In one embodiment, the control gates form the word lines. A continuous layer of conductive layer 336 is formed which is consistent across a word line in order to provide a common word line or control gate for each device on that word line. An individual control gate layer 336 is depicted in FIG. 3 which forms a single word line for a plurality of memory cells in a row. In such a case, this layer can be considered to form a control gate for each memory cell at the point where the layer overlaps a corresponding floating gate layer 332. In other embodiments, individual control gates can be formed and then interconnected by a separately formed word line.

When fabricating a NAND-based non-volatile memory system, including NAND strings as depicted in FIG. 3, it is important to provide electrical isolation in the word line direction between adjacent strings such as NAND strings 302 and 304. In the embodiment depicted in FIG. 3, NAND string 302 is separated from NAND string 304 by an open area or void 306. In typical NAND configurations, a dielectric material is formed between adjacent NAND strings and would be present at the position of open area 306.

Figure 4:
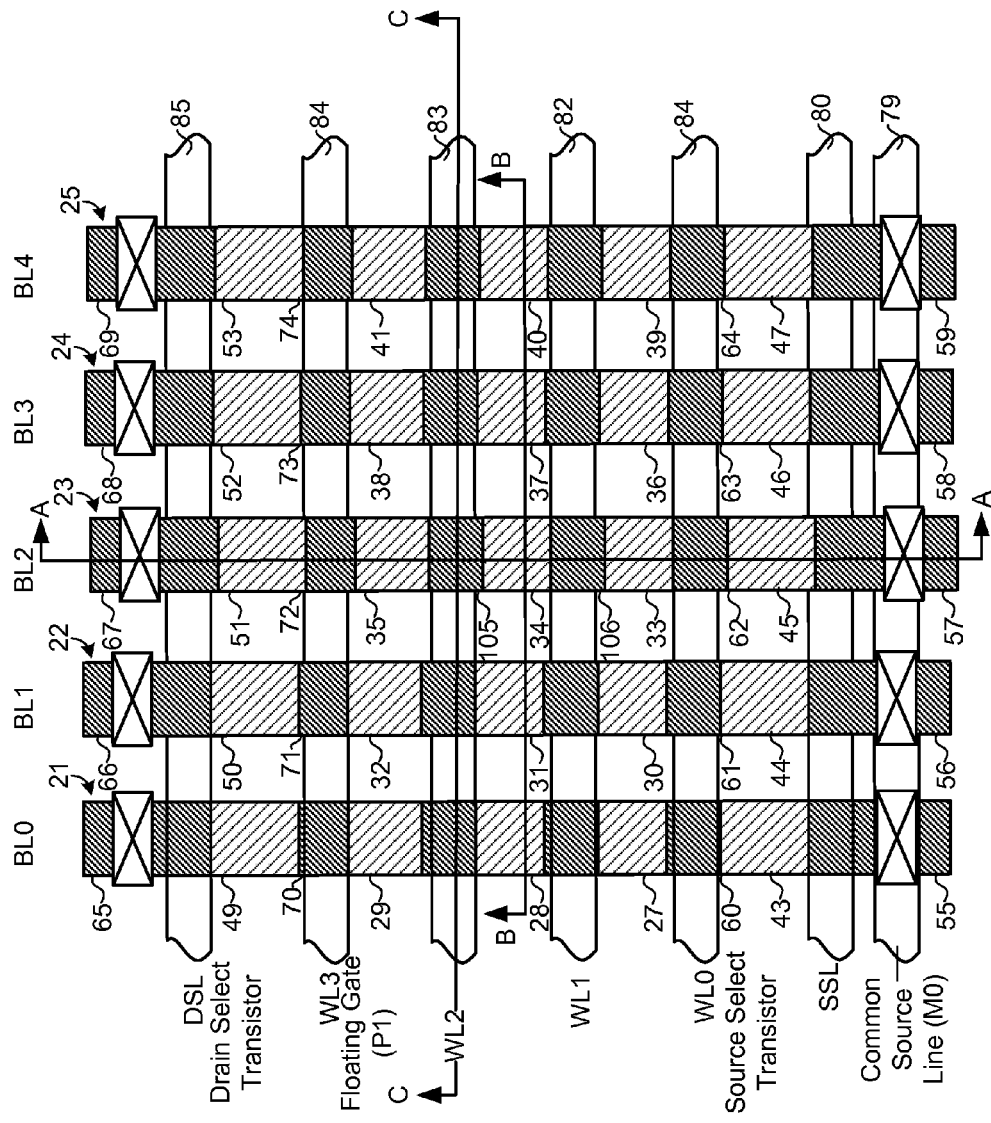
FIG. 4 is a plan view of a portion of a NAND flash memory array in accordance with one embodiment.

Major components of a few memory cells of a NAND array that can be fabricated in accordance with one embodiment are illustrated in plan view in FIG. 4. Five NAND strings 21-25 of series connected memory cells are included, with three floating gate charge storage elements shown in each string. String 21 includes floating gates 27, 28, 29, string 22 includes floating gates 30, 31, 32, string 23 includes floating gates 33, 34, 35, string 24 includes floating gates 36, 37, 38, and string 25 includes floating gates 39, 40, and 41. Only a small rectangular array of fifteen memory cells is illustrated for ease of explanation. Actual implementations of such an array typically include millions of such memory cells forming thousands of NAND strings, each string normally having 16, 32 or more memory cells. It is understood that the memory array is typically positioned over one or more well regions contained within a common substrate in order to allow the local substrate potential of the memory array to be electrically controlled independent of the common substrate potential. The use of the term substrate with respect to a memory array of transistors may include reference to such well regions.

Each of the NAND strings 21-25 includes two select transistors, one at each end of the string, to controllably connect the string between a different one of global bit lines BL0-BL4 and a reference potential $V_S$, typically provided at a common source line. $V_S$ is normally ground during reading but may assume a small positive value during programming to assist in minimizing leakage across the source select transistor. Voltage $V_{SSL}$ is applied to respective source select gates 43-47 to control connection of one end of their respective memory cell strings 21-25 to the common source line. The other ends of the strings 21-25 are connected through respective drain select transistors to the respective bit lines BL0-BL4 by voltage $V_{DSL}$ applied to drain select gates 49-53. Column control circuitry described hereinafter applies a voltage to each bit line that is representative of the specific data to be written, or to sense the voltage or current of a corresponding string or memory cell during a read or verify operation. The select transistors include respective source and drain regions 55-64 and 65-74 in a semiconductor substrate 402 at its surface 401.

A typical NAND array includes control gate (word) lines extending across multiple strings, over rows of floating gates with a suitable insulating dielectric layer therebetween. Close coupling between the control and floating gates is desirable in order to minimize the control gate voltages that are required to raise the coupled floating gates to the voltage levels necessary for programming and reading their states. One control gate (word) line is used for each row of floating gates. In order to make an array with the floating and control gates self-aligned in a y-direction (along the lengths of the NAND strings), the control gates are typically used as masks to form the floating gates, which then have the same dimensions in the y-direction as the control gates.

In the NAND array presented hereinafter, control gate (word) lines 81-84 are positioned between the floating gates instead of on top of them. Each control gate line extends across multiple strings of memory cells and is capacitively coupled through a suitable insulating dielectric, such as multi-layer oxide-nitride-oxide (ONO), to the floating gates on both sides. Additional coupling area is obtained by using the sidewall areas of both sides of the floating gates. The floating gates can be made thicker (higher) than usual in order to increase this coupling area, and the control gates in between them are then made to be at least as thick as the floating gates in order to take advantage of the added coupling area. An advantage is that this coupling area may be controlled largely independently of the coupling area of the floating gates and the substrate, resulting in a desirably high coupling ratio even as the coupling area of the floating gates with the substrate is reduced during future decreases in device dimensions. The principles, devices and techniques disclosed hereinafter can also be used with more traditional NAND architectures having word lines positioned above floating gates.

Figure 5:
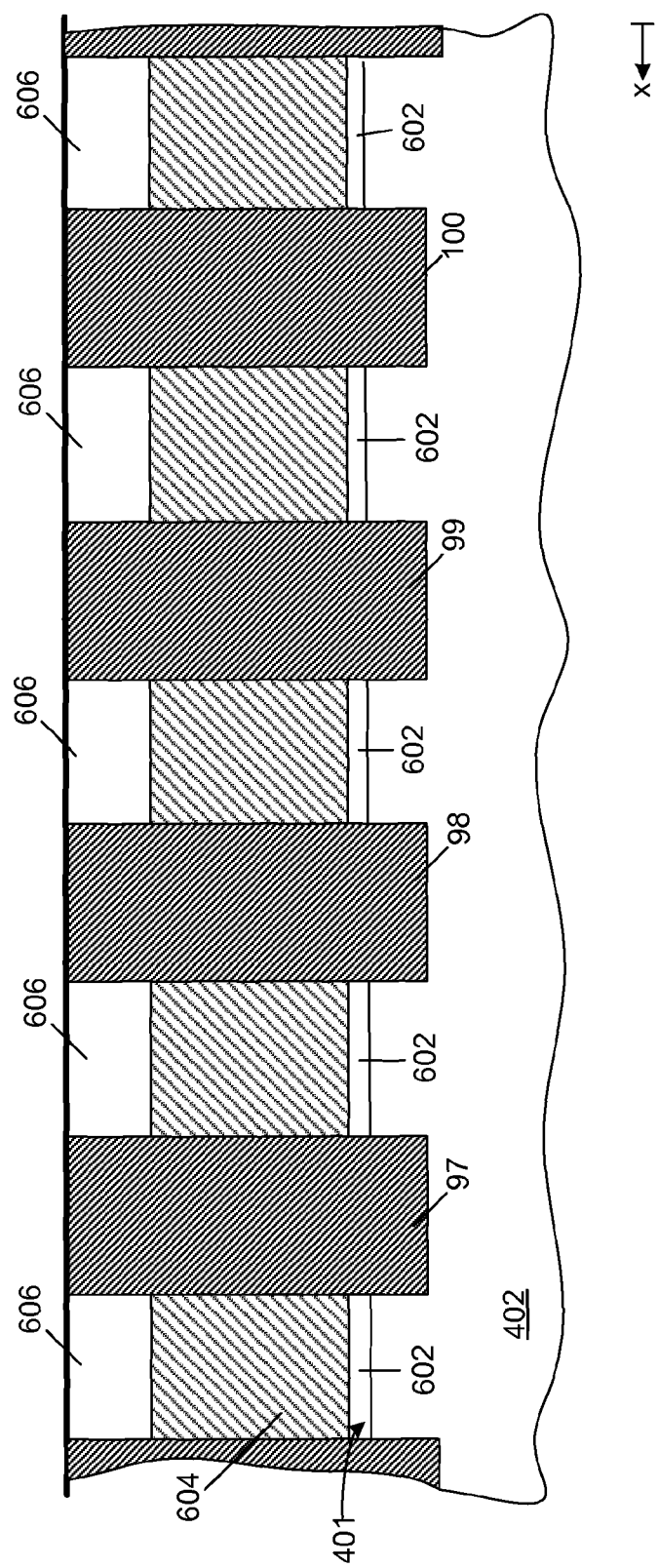
FIG. 5 is an orthogonal cross-sectional view taken along a line B--B of the portion of the flash memory array depicted in FIG. 4.

FIGS. 5 and 6A-6I depict the fabrication of a portion of an exemplary NAND memory array in accordance with one embodiment of the present invention. A small portion of the memory array is depicted at various steps of the fabrication process to highlight select portions of the process. Various other steps known to those of ordinary skill in the art are omitted for conciseness of explanation of the disclosed principles. Modifications to the disclosed process can be made in other implementations as will be appreciated. FIG. 5 depicts an orthogonal cross-sectional view taken along a line B-B in the x-direction along a row of memory cells extending across multiple strings depicted in FIG. 4. FIGS. 6A-6I) depict an orthogonal cross-sectional view taken along a line A-A in the y-direction through one string of memory cells depicted in FIG. 4. Note that in FIGS. 6A-6I, the substrate and well region(s) are not illustrated.

One or more wells (e.g., a triple well) are typically formed in substrate 402, according to the requirements of a particular implementation. After implanting and associated annealing of the well(s) to dope the substrate 402, a layer 602 of tunnel dielectric material is formed on the surface 401 of the substrate. Different materials can be used for layer 602, but silicon oxide ($SiO_2$) is often grown on the surface 401 to form a tunnel oxide having a thickness of about 8 nm. This thickness may vary in alternative embodiments. The dielectric layer can also be deposited using known chemical vapor deposition (CVD) processes, metal organic CVD processes, physical vapor deposition (PVD) processes, atomic layer deposition (ALD) processes, grown using a thermal oxidation process, or formed using another suitable process.

A first layer 604 of doped or undoped polysilicon is then formed over at least the area of the array, typically by low-pressure chemical vapor deposition (LPCVD), although other processes can be used. The floating gates will be formed later from this first polysilicon layer 604. Different thicknesses of the first polysilicon layer can be formed. For example, thicknesses ranging from 50 to 200 nm, for example 60 nm, can be used in one embodiment. Other embodiments may utilize other materials to form the charge storage regions.

A hardmask layer 606 is next formed over the polysilicon layer 604. Hardmask layer 606 exhibits high selectivity but is easily removed. In embodiments, hardmask layer 606 may be formed of a solution known as advanced patterning film ("APF") from Applied Materials, Inc., Santa Clara, Calif., and may be applied by deposition methods as described above or as known in the art. Hardmask layer 606 may in embodiments have a thickness of about 40 nm.

A photoresist mask may then be formed on the top of the hardmask layer 606 for etching the exposed hardmask, polysilicon and tunnel oxide to leave stacked strips elongated across the substrate in the y-direction, and separated from one another in the x-direction. Typically, the separation in the x-direction is the smallest spacing dimension resolvable by the mask formation process. The width of the strips is also preferably made equal to their spacing. The etch is anisotropic and exposes the surface 401 of the substrate 402 between these strips.

A next series of steps provides electrical isolation between resulting columns of floating gates. Shallow Trench Isolation (STI) is employed in one embodiment whereby the exposed substrate surface is anisotropically etched to form trenches 97-100 (FIG. 5) that are elongated in the y-direction and positioned between the polysilicon/dielectric stack strips in the x-direction. These trenches can be etched to a depth of 100-300 nm. The exposed silicon surface region may be implanted with a light boron dose to locally increase the field oxide threshold voltage if needed. A thick oxide layer is then deposited over the entire array area to completely fill these trenches and the spaces between the polysilicon/dielectric stacked strips. Excess oxide above the stacked strips is removed by chemical-mechanical polishing. A relatively flat surface then exists across the tops of the thick oxide 97-100 and oxide pad strips 606. As is well known in the art, high temperature annealing may be employed to relieve the mechanical stress in the silicon isolation trenches as well as to density the thick oxide in these trenches. The trenches isolate adjacent columns of memory cells and their corresponding active regions of the substrate from each other to define individual NAND strings.

Various techniques for forming the isolation trenches can be used. It is possible to form the array without employing shallow trench isolation, for example, by forming thick dielectric isolation above the silicon surface rather than in trenches etched into it. LOCOS or SWAMI techniques as previously described can be used in embodiments. In some embodiments, the isolation trenches may be formed prior to the floating gates and/or tunnel dielectric. Deep self-aligned trenches are formed in one embodiment, as described in: U.S. patent application Ser. No. 10/996,030, entitled "SELF-ALIGNED TRENCH FILLING WITH HIGH COUPLING RATIO," by Jack H. Yuan, filed Nov. 23, 2004; and U.S. patent application Ser. No. 11/251,386, entitled "SELF-ALIGNED TRENCH FILLING FOR NARROW GAP ISO-LOATION REGIONS," by Jack H. Yuan, filed Oct. 14, 2005, both incorporated by reference herein in their entirety.

A layer 608 of undoped polysilicon is then formed on top of the planarized surface. The polysilicon layer may have a thickness of about 20 nm. A sacrificial layer 610 of silicon oxide may then be formed on this undoped polysilicon layer 608. Different thicknesses of oxide layer 610 can be used. For example, the oxide may be deposited to a thickness of between 80 and 110 nm, for example 90 nm, in one embodiment. FIG. 6A depicts the portion of the memory array after forming intervening layer 608 and oxide layer 610. In an alternative embodiment, undoped polysilicon layer 608 and oxide layer 610 may be formed prior to etching the substrate surface to form the shallow isolation trenches, rather than after as described above.

Undoped polysilicon layer 608 can serve as an etch stop layer during later fabrication steps. Additionally, the undoped polysilicon will provide a stable base for subsequently formed polysilicon spacers used in the formation of individual floating gate regions. The material composition of layer 608 is chosen so as to provide adequate adhesion for these thinly formed spacers. The use of matched materials for the spacers and layer 608 serves the dual functions of providing an etch stop as part of the spacer formation, and providing a matched surface to facilitate adhesion of the spacers. Providing adequate adhesion between the spacers and an underlying layer is of increased importance as the spacers are continually fabricated with thinner dimensions and increased aspect ratios. Additionally, the use of the same or similar materials for the spacers and intervening layer can help with stresses between the different films. If layers of different materials are used, the different materials will have different coefficients of thermal expansion. The different thermal coefficients can cause stress at the interface of the different materials. When the same or similar materials are used in accordance with one or more embodiments as provided herein, matching thermal coefficients can decrease stresses at the material interfaces.

In traditional spacer fabrication processes, an additional etch stop layer 608 has not been provided. Moreover, an oxide layer is typically used in place of the hardmask layer 606. Spacers have been formed directly on the traditional high temperate oxide layer or other dielectric layer provided above the conductive polysilicon gate region 604. Simply forming polysilicon on the traditional oxide layer may not provide adequate adhesion to support the subsequently formed spacers. These thin spacers may essentially fall over or fail after being formed and directional supports (e.g., oxide 610) removed as part of the fabrication process. Other material combinations may also have inadequate adhesive properties, and consequently, not provide suitable rigidity and integrity for the fabrication. Additionally, when an additional polysilicon layer 608 is not used, thus exposing the oxide layer during subsequent etching of layer 610, the etch process may not stop precisely at the upper surface of the traditional oxide layer. This can damage the oxide such that unwanted growth may occur therein during subsequent fabrication steps. Additionally, unintended etching of the traditional oxide layer can ultimately result in undesirable variations in the thickness of the tunnel oxide layer 602. When variances in the tunnel oxide thickness occur, memory cell performance variances can also occur. For instance, variances in the thickness can affect the threshold voltage characteristics of the resulting memory cells. Programming, erasing and reading the memory cells can all be affected by variations in the characteristics of individual memory cells.

A process for forming the floating gates within the wafer is now described initially with respect to FIG. 6B. As will be explained hereinafter, the size and spacing between the initial spacers is selected to allow a desired configuration of the finished structure forming the floating gates and the spacing therebetween. In FIG. 6B, a mask is formed over oxide layer 610 to begin forming the individual floating gate regions for the array. The mask can be formed of strips of photoresist 615 that are formed over a bottom anti-reflective coating (BARC) 616. The masking strips are formed to extend in the x-direction, and have widths and spacing in the y-direction that are determined by the lithographically minimum resolvable element size. FIG. 6B depicts the portion of the memory array along line A-A after forming the strips of photoresist 615 and BARC 616. In one embodiment, the photoresist has a thickness of about 210 nm and the BARC has a thickness of about 90 nm.

Using the photoresist as a mask, oxide layer 610 is etched, resulting in the array as shown in FIG. 6C with oxide strips 611, 612 and 613. Polysilicon layer 608 serves as an etch stop layer when etching oxide layer 610 as described above. This differs from more traditional fabrication processes that do not use an intervening layer 608 that can provide a stop for the nitride etch process. Because etching is inherently uncontrollable to some extent, inadvertent etching and damage to layer 606 can occur in such instances, having the deleterious effects previously described. In the present disclosure, polysilicon layer 608 is highly selective to the oxide etching process. A suitable process selected for etching oxide layer 610 can abruptly stop the etching when polysilicon layer 608 is reached. In an alternative embodiment, silicon nitride may be used instead of polysilicon for stop layer 608, as oxide is used as the removal mask. A selective etch for oxide will stop upon reaching the polysilicon, thereby reducing or eliminating variances in the thickness of layer 606, which can ultimately lead to variances in the thickness of tunnel oxide layer 602.

The photoresist layer 615 and BARC layer 616 are next removed using a combination of $O_2$ plasma ashing followed by wet chemical etching in one embodiment as shown in FIG. 6D. A piranha oxidizing or other cleaning process can be used to remove remaining photoresist and other organic materials from the wafer surfaces. FIG. 6D shows the portion of the memory array after removing the photoresist to expose the upper surface of oxide layer 610 formed into strips 611-613. The width of the resulting strips can be made smaller than the width of the mask strips by undercutting or over-etching sideways. The relatively thick oxide strips 611-613 that result extend in the x-direction across the polysilicon layer 608 and the isolation oxide formed in trenches 97-100 (FIG. 5). In embodiments, each of the strips 611 through 613 may have a width of about 90 nm, and may be spaced from each other 140 nm. As explained hereinafter, this initial width and spacing of the strips 611-613 is important in that they allow the final even spacing of the control gates formed in layer 604. The etching step is further controlled in order not to remove excessive amounts of isolation oxide between the polysilicon strips formed in layer 604 extending in the y-direction (regions 97-100 in FIG. 5).

Figure 6E:
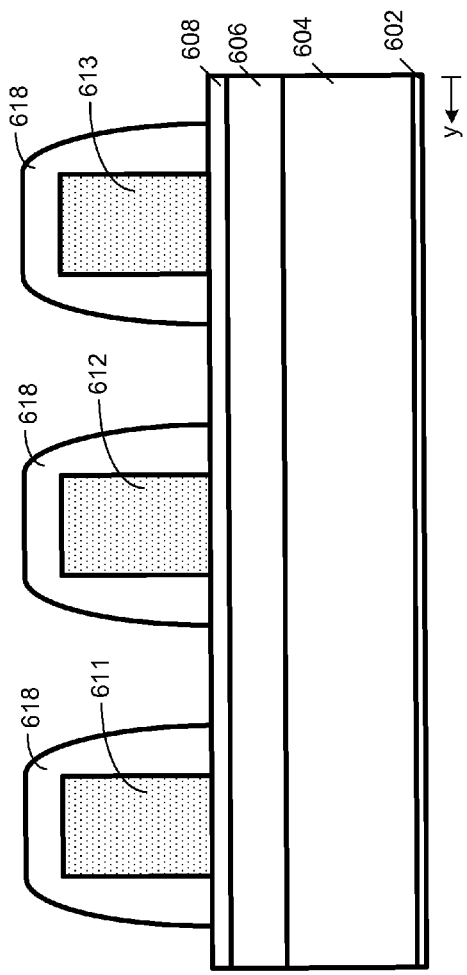
FIGS. 6A-6N depict a portion of the memory array of FIG. 4 at various steps during a fabrication process in accordance with one embodiment of the present invention.

A next series of steps forms a first set of spacers on either side of the oxide strips 611-613. Initially, a conformal deposition process, such as LPCVD, is used to form a conformal layer of silicon nitride ($Si_3N_4$) 618 (FIG. 6E). A conformal deposition process forms a layer of silicon nitride having a substantially uniform thickness on both the side portions and top portion of oxide strips 611-613. In embodiments, the nitride may be deposited to a thickness of approximately 1200 nm, though it may vary in alternative embodiments.

Figure 6F:
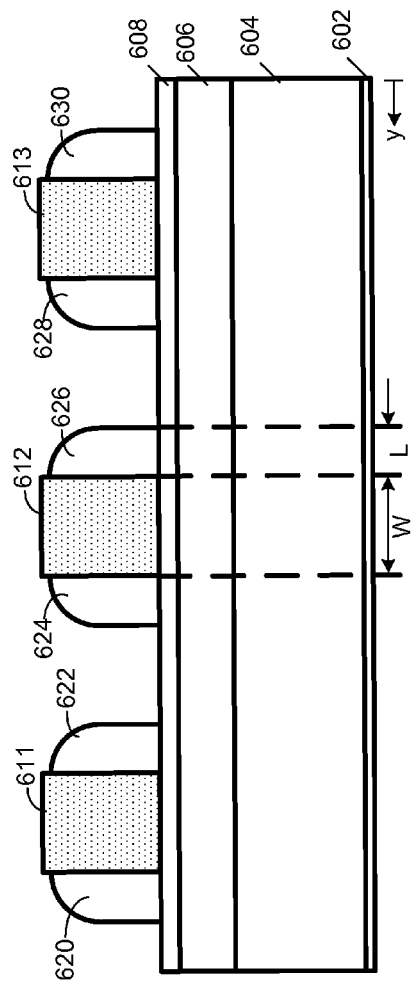

FIG. 6F depicts the memory array after etching the silicon nitride layer to form individual silicon nitride spacers 620-630. A dry etching process, for example reactive ion etching, is used in one embodiment to etch the silicon nitride until the oxide strips 611-613 are reached and the silicon nitride has been removed from the tops of the strips 611-613. The thickness of the deposited silicon nitride primarily determines a length L of the spacer, which in turn and as described later, determines the length of the floating gates, which is significantly less than the minimum width of the process being used to form the structure. A width W of the oxide strips and the length L of the silicon nitride spacers are preferably chosen to result in substantially equal spacing of the spacers along the lengths of the polysilicon strips 604, since this determines the spacing of the resulting floating gates in the y-direction. An optional annealing process can be performed after etching to form the polysilicon spacers. The reactive ion etch used in forming the spacers can damage the polysilicon sidewalls. This can result in unwanted etching of the damaged polysilicon during subsequent nitride removal steps. Annealing the exposed polysilicon can prevent undesirable etching.

Figure 6G:
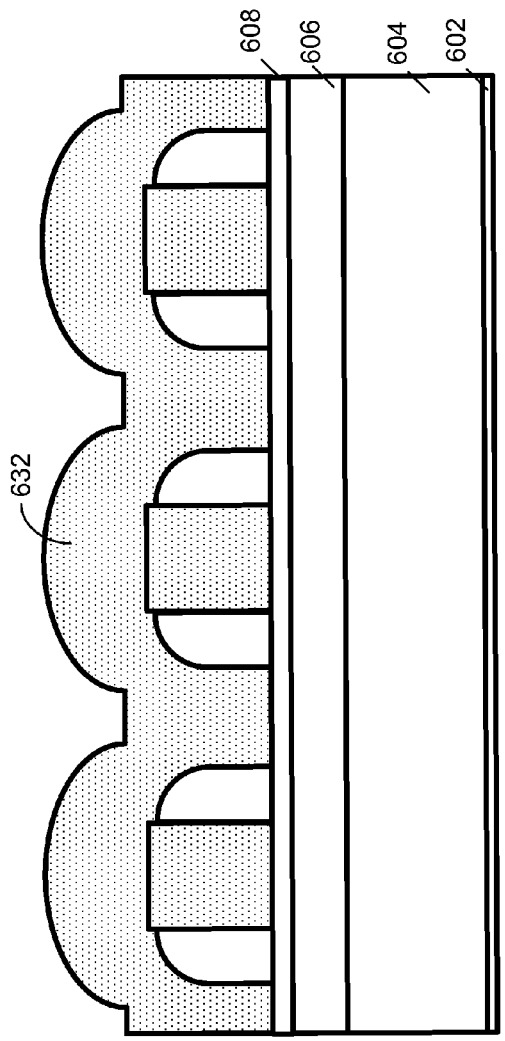

Next, a conformal deposition step (FIG. 6G) and chemical-mechanical polishing (CMP) step (FIG. 6H) are performed. The purpose of these steps is to remove the single rounded edge existing on spacers 620-630. Conventionally, a second spacer layer is formed on the first spacer layer. However, as discussed above, because the first spacer layer has a non-uniform profile (one rounded edge and one straight edge), forming the subsequent spacer layer on the conventional first spacer layer will result in an unpredictable and less robust profile of the second spacer layer. As the second spacer layer forms the mask for the resulting conductive gate regions, it is imperative that the profile of the second spacer layer be highly predictable, controllable and robust. Accordingly, in this embodiment, the first set of spacers are polished down to remove the single rounded edge and to provide the first set of spacers 620-630 with planar and parallel sidewalls. Accordingly, in this embodiment, after the spacers 620-630 are formed as shown in FIG. 6F, a conformal layer of oxide 632 is formed on oxide strips 611-613 and spacers 620-630 as shown in FIG. 6G. A known CMP step is next performed resulting in the planarization of the oxide and nitride layers as shown in FIG. 6H.

Figure 6H:
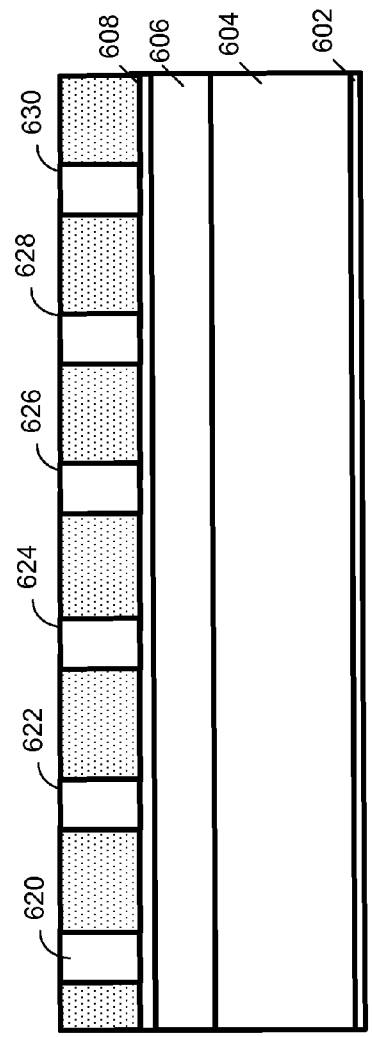
Figure 6I:
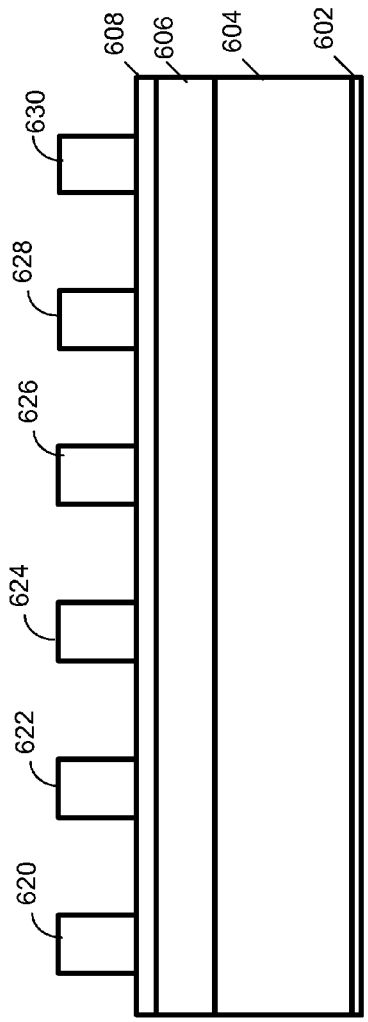

After the CMP step shown in FIG. 6H, the oxide strips are etched away as shown in FIG. 6I to leave a set of nitride spacers 620-630. In embodiments, the etching may be a wet-etch using for example hot phosphoric acid. Nitride spacers 620-630 have uniform sidewalls on which a second set of spacers may be formed. As can be appreciated from viewing FIGS. 6D-6I, the spacing between the nitride spacers 620-630 is even and is determined by the spacing of oxide strips 611-613 (FIG. 6D) and length of the spacers 620-630 (FIG. 6F).

Figure 6J:
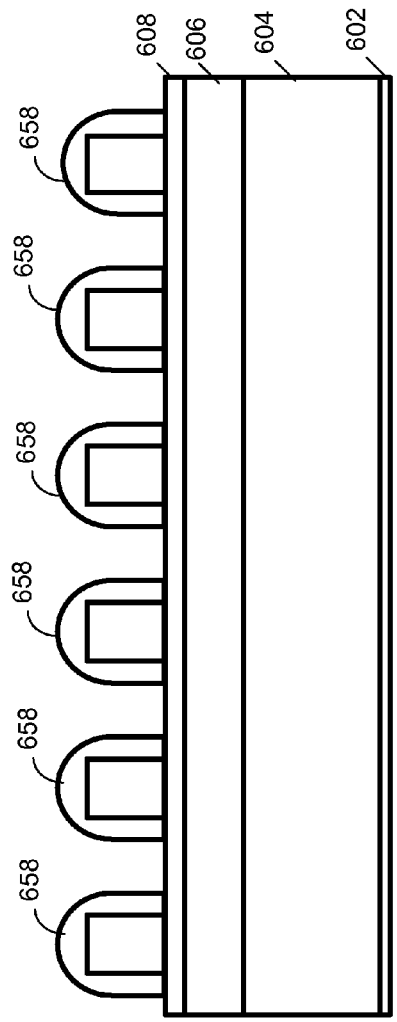

A series of steps form the second set of spacers that are later used as a mask to form the individual charge storage regions. Initially, a conformal deposition process, such as LPCVD, is used to form a conformal layer of polysilicon 658 (FIG. 6J). A conformal deposition process forms a layer of polysilicon having a substantially uniform thickness on both the side portions and top portion of nitride spacers 620-630.

Figure 6K:
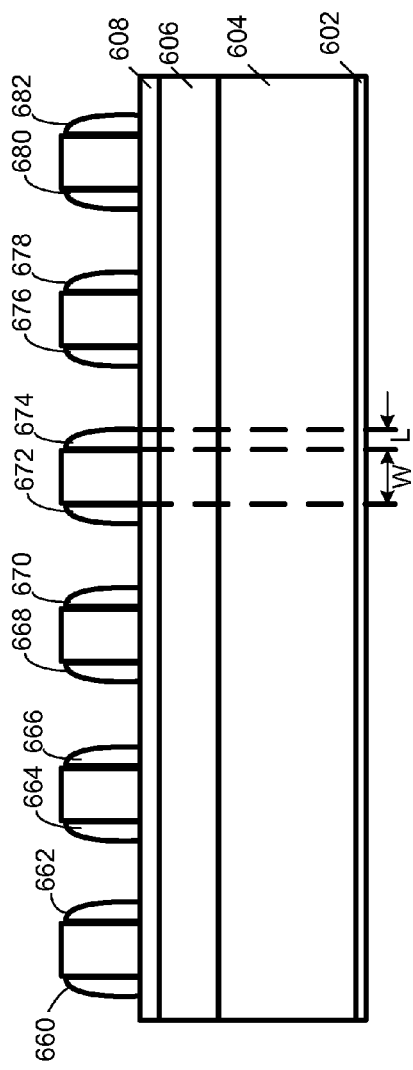

FIG. 6K depicts the memory array after etching the polysilicon layer to form individual polysilicon spacers 660-682. A dry etching process, for example reactive ion etching, is used in one embodiment to etch the polysilicon until the nitride spacers 620-630 are reached and the polysilicon has been removed from the tops of the nitride spacers 620-630. The thickness of the deposited polysilicon primarily determines a length L of the spacers 660-682, which in turn determines the length of the floating gates. This length is significantly less than the minimum width of the process being used to form the structure. A width W of the nitride spacers 620-630 and the length L of the polysilicon spacers 660-682 are preferably chosen to result in substantially equal spacing of the spacers along the lengths of the polysilicon strips 604, since this determines the spacing of the resulting floating gates in the y-direction. An optional annealing process can be performed after etching to form the polysilicon spacers. The reactive ion etch used in forming the spacers can damage the polysilicon sidewalls. This can result in unwanted etching of the damaged polysilicon during subsequent nitride removal steps. Annealing the exposed polysilicon can prevent undesirable etching.

Figure 6L:
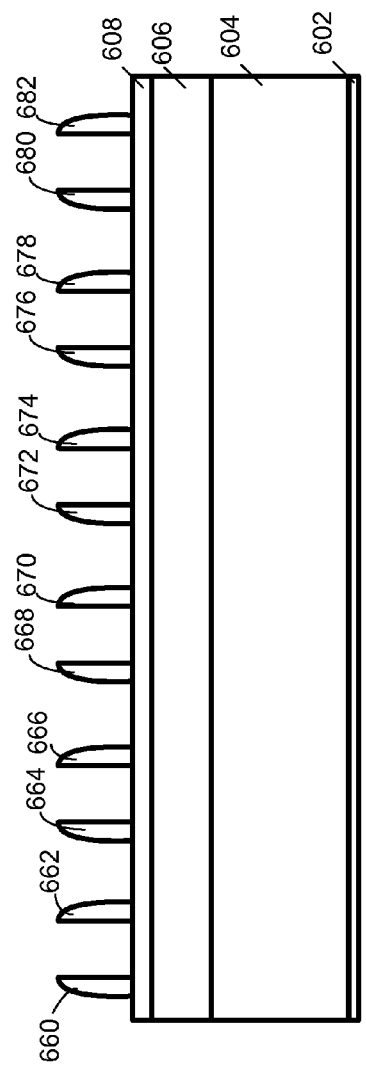

A wet etch is used to remove the nitride spacers 620-630 after forming the individual polysilicon spacers 660-682. The wet etch will leave the polysilicon spacers above the polysilicon etch stop layer 608. As previously described, the etch stop layer provides adhesion and support for the narrow and tall spacers resulting from the previous processes. FIG. 6L depicts the portion of the memory array after etching to remove the oxide strips. As can be appreciated from viewing FIGS. 6I-6L, the spacing between the polysilicon spacers 660-682 is even and is determined by the spacing of nitride spacers 620-630 (FIG. 6I) and length of the deposited polysilicon spacers 660-682 (FIG. 6K).

After removing nitride spacers 620-630, a combinational etch process is used to form the individual floating gate regions. A chemically non-selective etch is first used to remove the portions of intervening layer 608 and hardmask pad layer 606 between and outside of spacers 660-682. The non-selective etch also removes the polysilicon spacers. After etching completely through the hardmask layer 606, etching that is selective for polysilicon is used to etch through doped polysilicon layer 604.

Figure 6M:
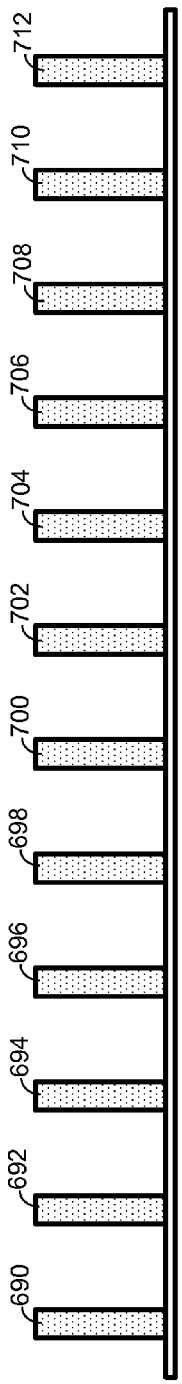

FIG. 6M depicts the individual floating gate regions resulting from the combinational etching applied with polysilicon spacers 660-682 formed above the polysilicon etch stop layer. The vertical profile of floating gate regions 690-712 is improved with respect to a profile achieved conventional techniques. A traditional process that forms the spacer on top of the oxide pad tends to cause an inward taper of the spacer away from the surface of the substrate.

Figure 6N:
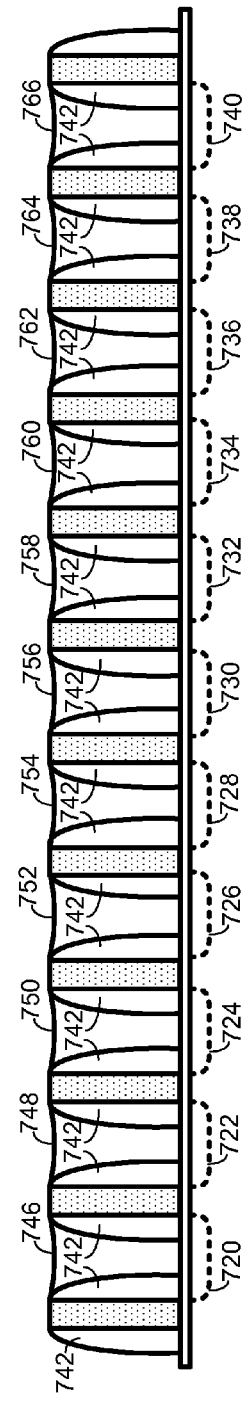

After etching the polysilicon to form floating gate regions, source and drain ion implantation can be performed, using the floating gates and oxide pads as a mask, as shown in FIG. 6N. Various ranges of N+ ion implant dose can be used, ranging from 5E13 to 1E15, for example. Implanted regions 720-740 between floating gates 690-712 are the result of ion implantation. An inter-gate dielectric 742 is then deposited and etched. The inter-gate dielectric 742 is often ONO but other materials can be used. Conformal processes can be used to provide a substantially constant thickness of the inter-gate dielectric relative to the upper surface and sidewalls of floating gate regions 690-712. A second layer of doped polysilicon is then deposited, for example by LPCVD, over the array to fill the gaps between floating gates in contact with dielectric layer 742. Excess polysilicon is removed by CMP or anisotropic etch back to the top oxide layer of the ONO, or to the upper surface of thin oxide pad layer 606.

An additional polysilicon etching step can be performed to ensure the polysilicon is not shorted between word lines and is adequately separated to form the individual word lines 746-766 as illustrated in FIG. 6N. The individual word lines 746-766 form the control gates for the memory cells. As described earlier, in the particular embodiment described in FIGS. 6A-6N, two control gates are provided for each floating gate, at the side thereof rather than above as in traditional NAND memory arrays. Various backend processes can be performed to finalize fabrication of the array. For example, a passivation dielectric layer can be deposited, followed by forming metal conductive lines and vias to connect the lines with source and drain regions at the end of the memory cell strings, and the control gate lines along their length.

As previously mentioned, the formation of shallow trench or other isolation regions can be performed at different stages of the fabrication process. In one embodiment, the control gate layer is deposited and etched to form the word lines prior to etching the previously formed floating gate layer. The floating gate layer is then etched to form the individual floating gates. Isolation trenches can be formed at the end of the process, after patterning and forming both the control and floating gates.

It is a feature of the present invention that, through the iterative spacer technique, the floating gate length and spacing between gates may be even with each other (or formed to some other desired end point length and spacing) using easily obtainable initial lithography dimensions. For example, in one embodiment, it is desirable to set the endpoint length of the floating gates 690-712 to be approximately (within tolerances) 30 nm and spaced apart from each other approximately (within tolerances) 30 nm. While such geometries are not obtainable using only standard lithography, the iterative spacer technique according to the present invention makes it possible. For example, the initial deposition may provide oxide strips 611-613 of approximately (within tolerances) 90 nm and spaced 150 nm from each other, which geometry is easily obtainable with conventional lithographic deposition techniques. Thereafter, by controlling the deposition of the first and second sets of spacers to provide both sets with spacers of approximately (within tolerances) 30 nm, the resulting floating gates 690-712 have the desired geography of length 30 nm and spacing 30 nm. Prior art spacer techniques do not contemplate controlling the geometry (length and spacing) of the start point and successive spacer layers to obtain a desired endpoint length and spacing.

FIGS. 7A-7L illustrate alternative processing steps for forming a structure of a memory cell according to embodiments of the present invention. The embodiment shown in FIGS. 7A-7L are similar to the embodiment of FIGS. 6A-6N, with the differences being that the embodiment of FIGS. 7A-7L begins with a film stack having a larger number of layers, and the embodiment of FIGS. 7A-7L omits the oxide fill and CMP steps. FIGS. 7A-7L depict an orthogonal cross-sectional view taken along a line A-A in the y-direction through one string of memory cells depicted in FIG. 4. Note that in FIGS. 7A-7L, the substrate and well region(s) are not illustrated.

Figure 7A:
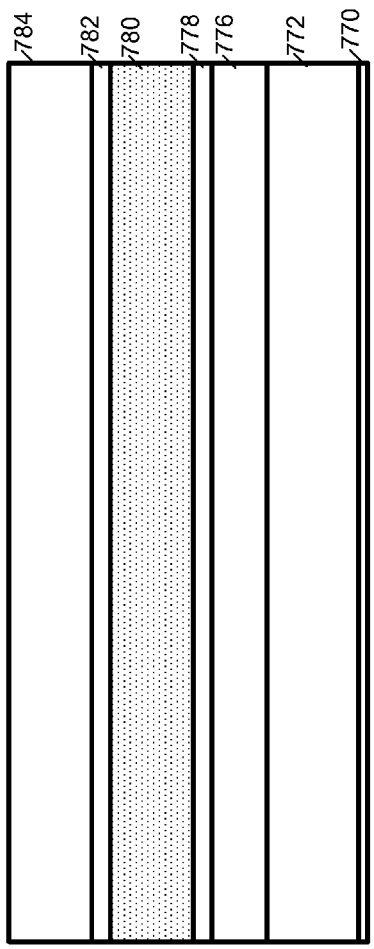

The structure shown in FIG. 7A includes a substrate (not shown in FIG. 7A) having one or more wells as is known. After implanting and associated annealing of the well(s) to dope the substrate, a layer 770 of tunnel dielectric material is formed on the surface of the substrate. Different materials can be used for layer 770, but silicon oxide may be used having a thickness of about 8 nm. This thickness may vary in alternative embodiments. The dielectric layer can also be deposited using known chemical vapor deposition (CVD) processes, metal organic CVD processes, physical vapor deposition (PVD) processes, atomic layer deposition (ALD) processes, grown using a thermal oxidation process, or formed using another suitable process.

A layer 772 of doped or undoped polysilicon is then formed over at least the area of the array, typically by LPCVD, although other processes can be used. The floating gates will be formed later from this polysilicon layer. Different thicknesses of the first polysilicon layer can be formed. For example, thicknesses ranging from 50 to 200 nm can be used in one embodiment. This is thicker than the usual first polysilicon layer in many NAND devices, with the result that the later formed floating gates are thicker than those of many traditional devices. Other embodiments may utilize other materials to form the charge storage regions.

A hardmask layer 776 is next formed over the polysilicon layer 772. Hardmask layer 776 exhibits high selectivity but is easily removed. In embodiments, hardmask layer 776 may be formed of APF, and may be applied by deposition methods as described above or as known in the art.

A photoresist mask may then be formed on the top of the hardmask layer 776 for etching the exposed hardmask, polysilicon and tunnel oxide to leave stacked strips elongated across the substrate in the y-direction, and separated from one another in the x-direction. Typically, the separation in the x-direction is the smallest spacing dimension resolvable by the mask formation process. The width of the strips is also preferably made equal to their spacing. The etch is anisotropic and exposes the surface of the substrate between these strips.

A next series of steps provides electrical isolation between resulting columns of floating gates as described above. Shallow Trench Isolation (STI) is employed in one embodiment whereby the exposed substrate surface is anisotropically etched to form trenches 97-100 (FIG. 5) that are elongated in the y-direction and positioned between the polysilicon/dielectric stack strips in the x-direction. These trenches can be etched to a depth of 100-300 nm.

A layer 778 of undoped polysilicon is then formed on top of the planarized surface of the hardmask layer 776. A first sacrificial layer 780 of silicon oxide may then be formed on this undoped polysilicon layer 778. The sacrificial layer of silicon oxide 780 is shown shaded for clarity in FIGS. 7A-7K. A second layer 782 of undoped polysilicon is then formed on top of the first sacrificial layer 780. A second sacrificial layer 784 of silicon oxide may then be formed on the second undoped polysilicon layer 782. Different thicknesses of oxide layers 780, 784 can be used. For example, the oxide may be formed to a thickness of between 80 and 110 nm in one embodiment.

Undoped polysilicon layers 778, 782 each serve as an etch stop layer during later fabrication steps. Additionally, the undoped polysilicon layers provide a stable base for subsequently formed polysilicon spacers used in the formation of individual floating gate regions. In an alternative embodiment, silicon nitride may be used instead of polysilicon for etch stop layers 778, 782, as oxide is used as the removal mask.

Figure 7B:
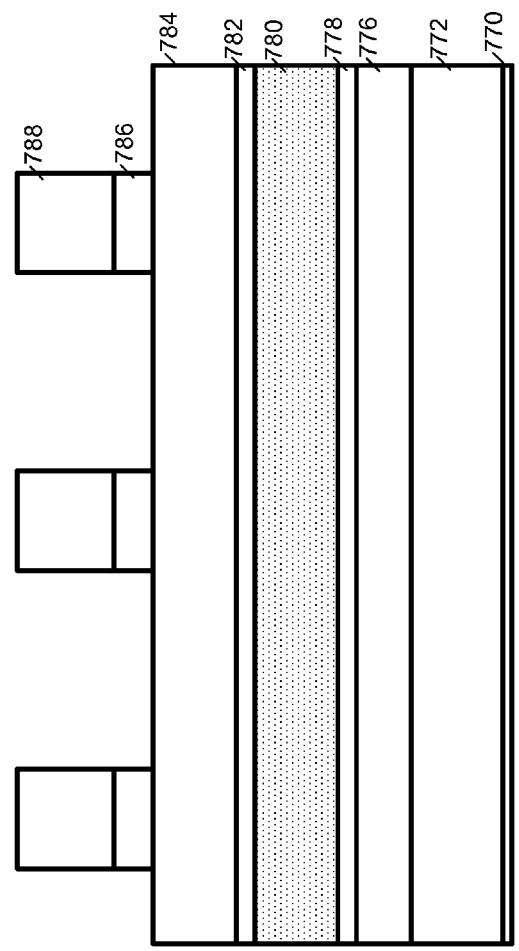

A process for forming the floating gates within the wafer is now described initially with respect to FIG. 7B. As explained above, the size and spacing between the initial spacers is selected to allow a desired configuration of the finished structure forming the floating gates and the spacing therebetween. In FIG. 7B, a mask is formed over oxide layer 784 to begin forming the individual floating gate regions for the array. The mask can be formed of strips of photoresist 788 that are formed over a BARC 786. The masking strips are formed to extend in the x-direction, and have widths and spacing in the y-direction that are determined by the lithographically minimum resolvable element size. FIG. 7B depicts the portion of the memory array along line A-A after forming the strips of photoresist 788 and BARC 786. In one embodiment, the photoresist has a thickness of about 210 nm and the BARC has a thickness of about 90 nm.

Using the photoresist as a mask, the first oxide layer 784 is etched, resulting in the array as shown in FIG. 7C with oxide strips 790-794. Polysilicon layer 782 serves as an etch stop layer when etching oxide layer 784 as described above. A suitable process selected for etching oxide layer 784 can abruptly stop the etching when polysilicon layer 782 is reached. A selective etch for oxide will stop upon reaching the polysilicon, thereby reducing or eliminating variances in the thickness of layer 784, which can ultimately lead to variances in the thickness of tunnel oxide layer 770.

The photoresist layer 788 and BARC layer 786 are next removed using a combination of $O_2$ plasma ashing followed by wet chemical etching in one embodiment as shown in FIG. 7D. A piranha oxidizing or other cleaning process can be used to remove remaining photoresist and other organic materials from the wafer surfaces. FIG. 7D shows the portion of the memory array after removing the photoresist to expose the upper surface of oxide layer 784 formed into strips 790-794. The width of the resulting strips can be made smaller than the width of the mask strips by undercutting or over-etching sideways. The relatively thick oxide strips 790-794 that result extend in the x-direction across the polysilicon layer 782 and the isolation oxide formed in trenches 97-100 (FIG. 5). The etching step is further controlled in order not to remove excessive amounts of isolation oxide between the polysilicon strips 604 extending in the y-direction (regions 97-100 in FIG. 5).

A next series of steps forms a first set of spacers on either side of the oxide strips 790-794. Initially, a conformal deposition process, such as LPCVD, is used to form a conformal layer of silicon nitride 798 (FIG. 7E). A conformal deposition process forms a layer of silicon nitride having a substantially uniform thickness on both the side portions and top portion of oxide strips 790-794. In embodiments, the nitride may be deposited to a thickness of approximately 1200 nm, though it may vary in alternative embodiments. The silicon nitride layer 798 can alternatively be deposited using known CVD processes, metal organic CVD processes, PVD processes, ALD processes or formed using another suitable process in alternative embodiments.

FIG. 7F depicts the memory array after etching the silicon nitride layer to form individual silicon nitride spacers 800-810. A dry etching process, for example reactive ion etching, is used in one embodiment to etch the silicon nitride until the oxide strips 790-794 are reached and the silicon nitride has been removed from the tops of the strips 790-794. The thickness of the deposited silicon nitride primarily determines a length L of the spacer, which in turn and as described later, determines the length of the floating gates, which is significantly less than the minimum width of the process being used to form the structure. A width W of the oxide strips and the length L of the silicon nitride spacers are preferably chosen to result in substantially equal spacing of the spacers along the lengths of the polysilicon strips 772 (described hereinafter), since this determines the spacing of the resulting floating gates in the y-direction. An optional annealing process can be performed after etching to form the polysilicon spacers. The reactive ion etch used in forming the spacers can damage the polysilicon sidewalls. This can result in unwanted etching of the damaged polysilicon during subsequent nitride removal steps. Annealing the exposed polysilicon can prevent undesirable etching.

Figure 7G:
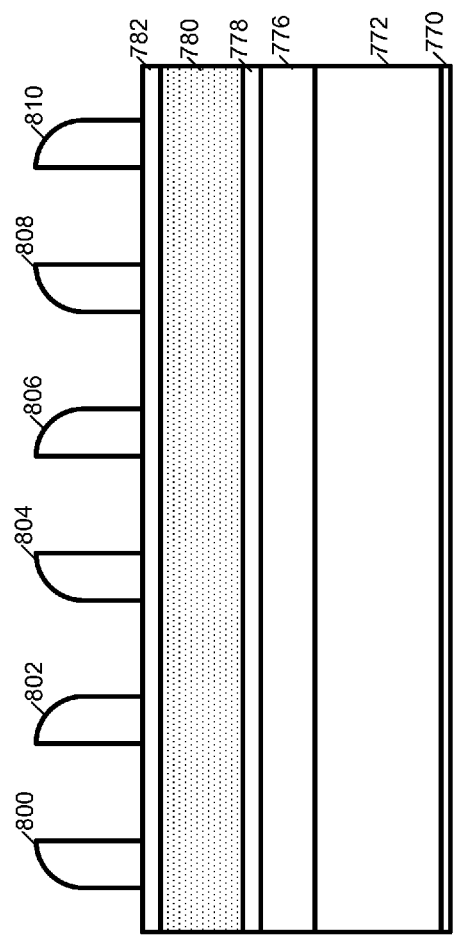
Figure 7H:
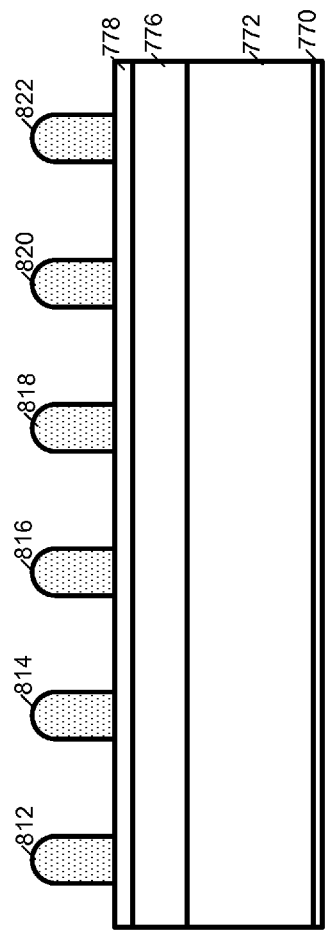

Referring now to FIG. 7G, the set of oxide strips 790-794 are etched away to leave the set of nitride spacers 800-810. In embodiments, the etching may be a wet-etch using for example hot phosphoric acid. Thereafter, a combinational etch process is used to form the oxide strips 812-822 shown in FIG. 7H. The purpose of this step is to remove the single rounded edge existing on spacers 800-810. Conventionally, a second spacer layer is formed on the first spacer layer. However, as discussed above, because the first spacer layer has a non-uniform profile (one rounded edge and one straight edge), forming the subsequent spacer layer on the conventional first spacer layer will result in an unpredictable and less robust profile of the second spacer layer. As the second spacer layer forms the mask for the resulting conductive gate regions, it is imperative that the profile of the second spacer layer be highly predictable, controllable and robust. Accordingly, in this embodiment, the first set of spacers 800-810 are not used as supports for the second set of spacers, but are instead used as a mask for forming the oxide structures 812-822. Oxide structures 812-822 have planar and parallel sidewalls, as well as a rounded top. As the top is uniformly rounded (instead of rounded on only one side as in spacers 800-810), the rounded top does not adversely affect the subsequent deposition of the second set of spacers. It is contemplated that the tops may be removed in alternative embodiments (as by filling in the spaces between the oxide strips 812-822 and performing a CMP step).

In order to form the oxide strips 812-822 from spacers 800-810, an etch selective to both polysilicon and oxide is used to remove the polysilicon layer 782, oxide strips 800-810 and portions of oxide layer 780 not masked by oxide strips 800-810. The one or more chemicals and timing of the etching process may be controlled as is known to remove the oxide at a greater rate than the relatively thinner polysilicon layer, to ensure that the oxide is removed down to polysilicon layer 778. The result is oxide strips 812-822 shown in FIG. 7H.

Figure 7I:
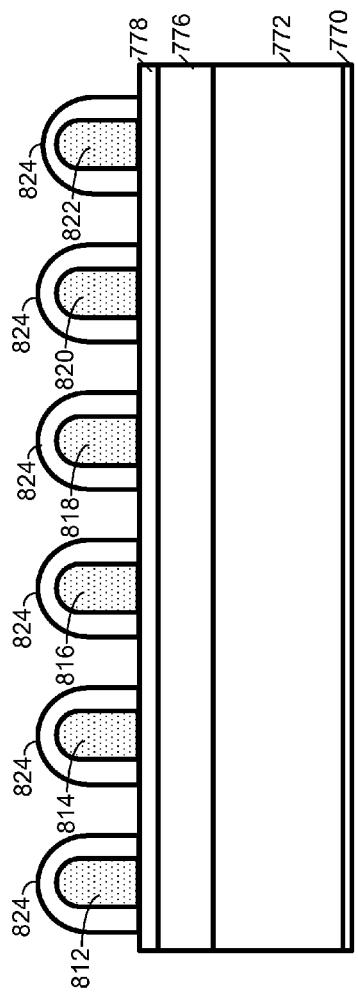

In order to form the second set of spacers on strips 812-822, a conformal deposition process, such as low LPCVD, is used to form a conformal layer of polysilicon 824 (FIG. 7I). A conformal deposition process forms a layer of polysilicon having a substantially uniform thickness on both the side portions and top portion of oxide strips 812-822.

Figure 7J:
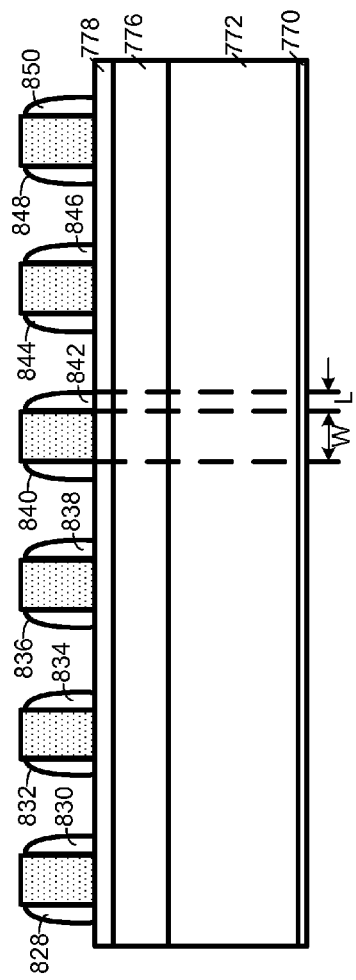

FIG. 7J depicts the memory array after etching the polysilicon layer 824 to form individual polysilicon spacers 828-850. A dry etching process, for example reactive ion etching, is used in one embodiment to etch the polysilicon until the oxide strips 812-822 are reached and the polysilicon has been removed from the tops of the strips 812-822. The thickness of the deposited polysilicon primarily determines a length L of the spacer, which in turn determines the length of the floating gates, which is significantly less than the minimum width of the process being used to form the structure. A width W of the oxide strips and the length L of the silicon nitride spacers are preferably chosen to result in substantially equal spacing of the spacers along the lengths of the polysilicon strips formed in layer 772, since this determines the spacing of the resulting floating gates in the y-direction. An optional annealing process can be performed after etching to form the polysilicon spacers. The reactive ion etch used in forming the spacers can damage the polysilicon sidewalls. This can result in unwanted etching of the damaged polysilicon during subsequent nitride removal steps. Annealing the exposed polysilicon can prevent undesirable etching.

A wet etch is used to remove the oxide strips 812-822 after forming the individual spacers 828-850. The wet etch will leave the polysilicon spacers above the polysilicon etch stop layer 778. As previously described, the etch stop layer provides adhesion and support for the narrow and tall spacers resulting from the previous processes. FIG. 7K depicts the portion of the memory array after etching to remove the oxide strips.

After removing oxide strips 812-822, a combinational etch process is used to form the individual floating gate regions. A chemically non-selective etch is first used to remove the portions of intervening layer 778 and hardmask pad layer 776 between and outside of spacers 828-850. The non-selective etch also removes the polysilicon spacers. After etching completely through the hardmask layer 776, etching that is selective for polysilicon is used to etch through doped polysilicon layer 772.

FIG. 7L depicts the individual floating gate regions resulting from the combinational etching applied with polysilicon spacers 828-850 formed above the polysilicon etch stop layer. The vertical profile of floating gate regions 852-874 is improved with respect to a profile achieved conventional techniques. A traditional process that forms the spacer on top of the oxide pad tends to cause an inward taper of the spacer away from the surface of the substrate.

After etching the polysilicon to form floating gate regions, source and drain ion implantation can be performed, using the floating gates and oxide pads as a mask, as shown and described above with respect to FIG. 6N. The inter-gate dielectric and word-line control gates may also be formed as shown and described above with respect to FIG. 6N.

It is similarly a feature of this embodiment that, through the iterative spacer technique, the floating gate length and spacing between gates may be even with each other (or formed to some other desired end point length and spacing) using easily obtainable initial lithography dimensions. Again, the floating gates 690-712 may be obtained with approximately (within tolerances) 30 nm length and spacing using an initial deposition of oxide strips 611-613 of approximately (within tolerances) 90 nm, spaced 150 nm from each other (easily obtainable with conventional lithographic deposition techniques), and thereafter controlling the deposition of the first and second sets of spacers to provide each set with spacers of approximately (within tolerances) 30 nm. Prior art spacer techniques do not contemplate controlling the geometry (length and spacing) of the start point and successive spacer layers to obtain a desired endpoint length and spacing.

Figure 8:
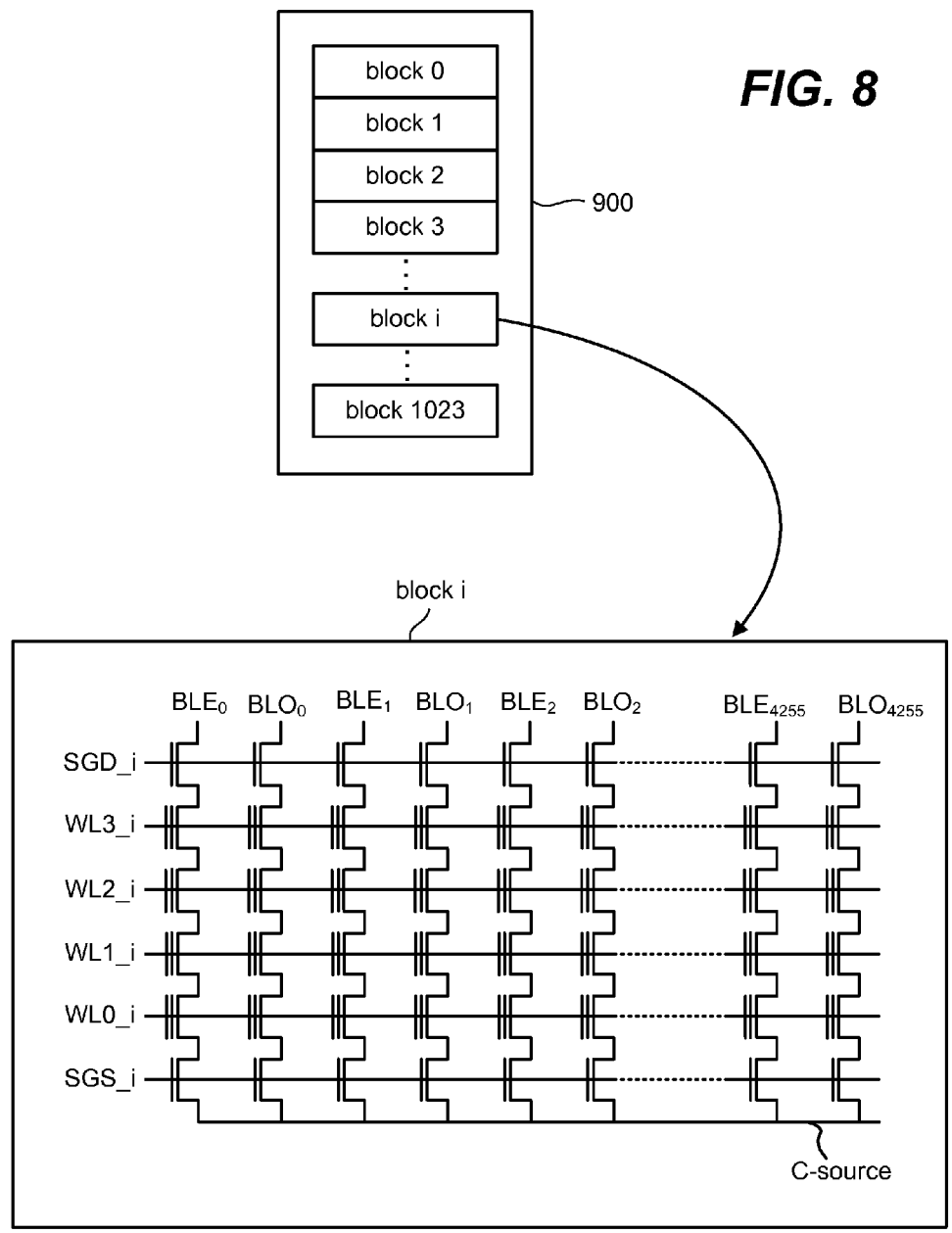
FIG. 8 depicts an exemplary organization of a memory array in accordance with one embodiment.

FIG. 8 depicts an exemplary structure of a memory cell array 900 that can be fabricated using one or more embodiments of the disclosed technology. As one example, a NAND flash EEPROM is described that is partitioned into 1,024 blocks. The data stored in each block can be simultaneously erased. In one embodiment, the block is the minimum unit of cells that are simultaneously erased. In each block, in this example, there are 8,512 columns that are divided into even columns and odd columns. The bit lines are also divided into even bit lines (BLE) and odd bit lines (BLO). FIG. 8 shows four memory cells connected in series to form a NAND string. Although four cells are shown to be included in each NAND string, more or less than four can be used (e.g., 16, 32, or another number). One terminal of the NAND string is connected to a corresponding bit line via a first select transistor (also referred to as a select gate) SGD, and another terminal is connected to c-source via a second select transistor SGS.

During read and programming operations for memory cells of one embodiment, 4,256 memory cells are simultaneously selected. The memory cells selected have the same word line (e.g. WL2-i), and the same kind of bit line (e.g. even bit lines). Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-level cell), one block stores 16 pages. In another embodiment, a memory array is formed that utilizes an all bit-line architecture such that each bit line within a block is simultaneously selected, including those adjacent in the x-direction.

Figure 9:
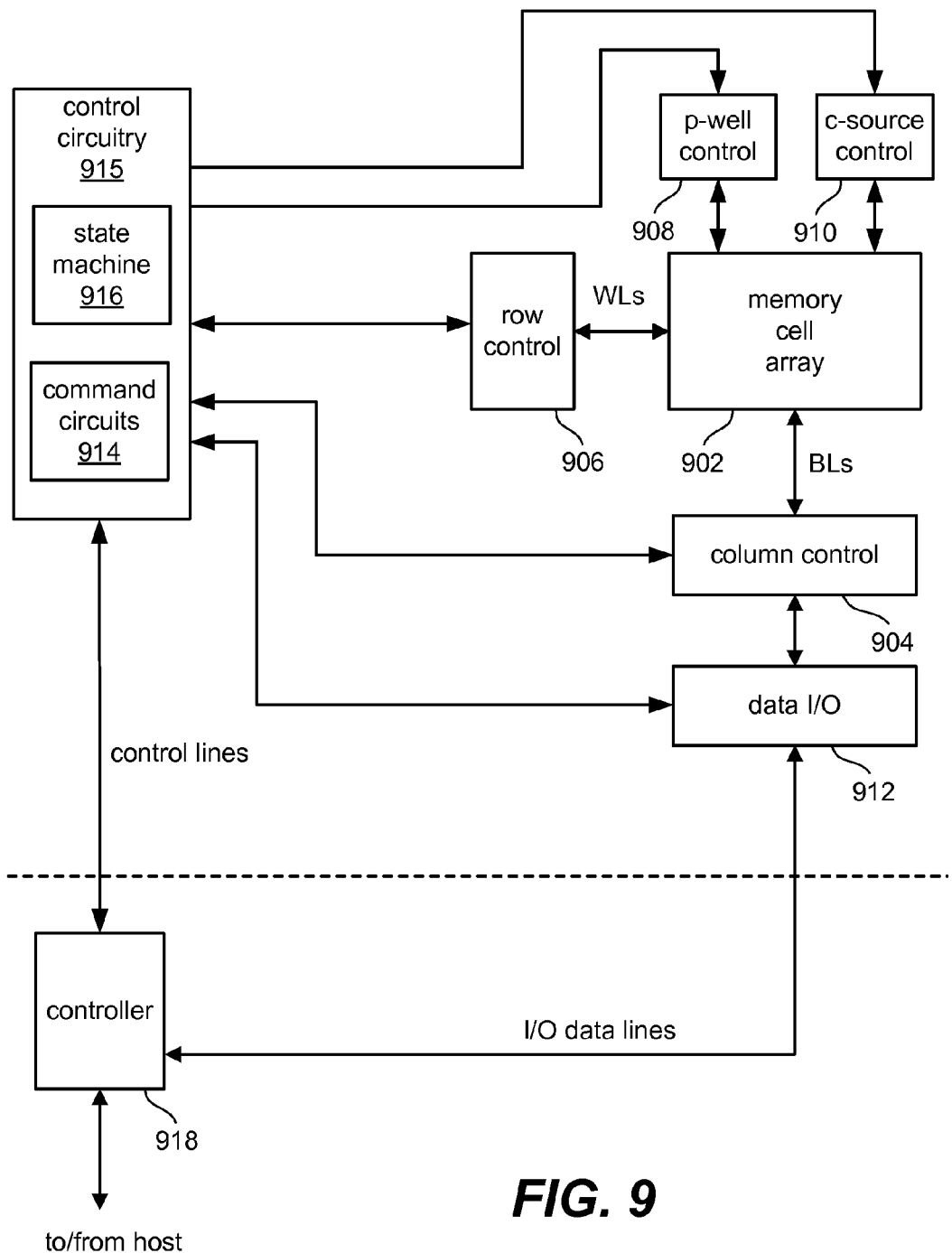
FIG. 9 is a block diagram of an exemplary memory system that can be used to implement one embodiment of the disclose technology.

FIG. 9 is a block diagram of one embodiment of a flash memory system that can be used to implement one or more embodiments of the present disclosure. Other systems and implementations can also be used. Memory cell array 902 is controlled by column control circuit 904, row control circuit 906, c-source control circuit 910 and p-well control circuit 908. Column control circuit 904 is connected to the bit lines of memory cell array 902 for reading data stored in the memory cells, for determining a state of the memory cells during a program operation, and for controlling potential levels of the bit lines to promote or inhibit programming and erasing. Row control circuit 906 is connected to the word lines to select one of the word lines, to apply read voltages, to apply program voltages combined with the bit line potential levels controlled by column control circuit 904, and to apply an erase voltage. C-source control circuit 910 controls a common source line (labeled as "C-source" in FIG. 7) connected to the memory cells. P-well control circuit 908 controls the p-well voltage.

The data stored in the memory cells are read out by the column control circuit 904 and are output to external I/O lines via data input/output buffer 912. Program data to be stored in the memory cells are input to the data input/output buffer 912 via the external I/O lines, and transferred to the column control circuit 904. The external I/O lines are connected to controller 918.

Command data for controlling the flash memory device is input to controller 918. The command data informs the flash memory of what operation is requested. The input command is transferred to state machine 916 which is part of control circuitry 915. State machine 916 controls column control circuit 904, row control circuit 906, c-source control circuit 910, p-well control circuit 908 and data input/output buffer 912. State machine 916 can also output status data of the flash memory such as READY/BUSY or PASS/FAIL.

Controller 918 is connected to or connectable with a host system such as a personal computer, a digital camera, or personal digital assistant, etc. It communicates with the host that initiates commands, such as to store or read data to or from the memory array 902, and provides or receives such data. Controller 918 converts such commands into command signals that can be interpreted and executed by command circuits 914 which are part of control circuitry 915. Command circuits 914 are in communication with state machine 916. Controller 918 typically contains buffer memory for the user data being written to or read from the memory array.

One exemplary memory system comprises one integrated circuit that includes controller 918, and one or more integrated circuit chips that each contain a memory array and associated control, input/output and state machine circuits. There is a trend to integrate the memory arrays and controller circuits of a system together on one or more integrated circuit chips. The memory system may be embedded as part of the host system, or may be included in a memory card (or other package) that is removably inserted into the host systems. Such a card may include the entire memory system (e.g. including the controller) or just the memory array(s) with associated peripheral circuits (with the controller or control function being embedded in the host). Thus, the controller can be embedded in the host or included within the removable memory system.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

We claim:

1. A method of forming an integrated semiconductor device, comprising the steps of:
   (a) defining a plurality of strips of a first material on a layer formed on a substrate, the plurality of strips including sidewalls substantially orthogonal to the layer formed on the substrate;
   (b) depositing a second material on each pair of sidewalls of the plurality of sidewalls;
   (c) etching the second material to define a first set of spacers on sidewalls of the plurality of strips, gaps being defined between spacers of adjacent strips of the plurality of strips;
   (d) depositing a third material over the plurality of strips and first set of spacers, and in the gaps between spacers;
   (e) polishing down the third material, the strips and the first set of spacers to define a planar surface;
   (f) etching the plurality of strips and third material in the gaps to expose sidewalls on the first set of spacers, the sidewalls of the first set of spacers being substantially orthogonal to the layer formed on the substrate;
   (g) depositing a fourth material on the sidewalls of the first set of spacers;
   (h) etching the fourth material to define a second set of spacers on the sidewalls of the first set of spacers; and
   (i) etching the first set of spacers to leave the second set of spacers, the second set of spacers forming a mask for defining elements in a layer beneath the second set of spacers.

2. A method as recited in claim 1, wherein said step (a) comprises the step of defining the first plurality of strips to strips of approximately 90 nm and spaced from each other 150 nm.

3. A method as recited in claim 2, wherein said step (c) comprises the step of etching the second material to define the first set of spacers each having a length orthogonal to the layer defined in said step (a) of 30 nm.

4. A method as recited in claim 3, wherein said step (h) comprises the step of etching the fourth material to define the second set of spacers each having a length orthogonal to the layer defined in said step (a) of 30 nm.

5. A method as recited in claim 1, wherein the first material and third material are the same material.

6. A method as recited in claim 1, wherein the first material is silicon oxide.

7. A method as recited in claim 1, wherein the second material is silicon nitride.

8. A method as recited in claim 1, wherein the fourth material is polysilicon.

9. A method as recited in claim 1, wherein said step (e) of polishing comprises a chemical-mechanical polishing.

10. A method as recited in claim 1, further comprising the step of using the second set of spacers as a mask to define a plurality of conductive gate regions on the substrate.

* * * * *